United States Patent [19]

Ohyama et al.

[11] Patent Number: 4,500,920
[45] Date of Patent: Feb. 19, 1985

[54] RF MODULATOR

[75] Inventors: Tohru Ohyama, Miyagi; Shigeru Nigorikawa, Kakuda, both of Japan

[73] Assignee: Alps Electric Co., Ltd., Tokyo, Japan

[21] Appl. No.: 394,142

[22] Filed: Jul. 1, 1982

[30] Foreign Application Priority Data

Jul. 1, 1981 [JP] Japan .............................. 56-98215[U]

[51] Int. Cl.³ .............................................. H04N 7/18
[52] U.S. Cl. .................................. 358/139; 358/181; 358/186; 455/67; 455/226; 455/300
[58] Field of Search ................. 358/139, 10, 186, 181; 455/115, 226, 300, 301, 67

[56] References Cited

U.S. PATENT DOCUMENTS

| | | | |
|---|---|---|---|
| 2,913,577 | 11/1959 | Johnson | 455/300 |
| 3,775,554 | 11/1973 | Hjortzberg | 358/1 |
| 3,775,555 | 11/1973 | Carlson | 358/186 |
| 4,158,857 | 6/1979 | Hiraguri | 358/139 |
| 4,213,152 | 7/1980 | Kakinuma | 358/186 |
| 4,214,258 | 7/1980 | van der Valk | 358/139 |
| 4,214,360 | 7/1980 | Tuma et al. | 29/829 |
| 4,386,377 | 5/1983 | Hunter | 358/186 |

Primary Examiner—Howard W. Britton
Attorney, Agent, or Firm—Guy W. Shoup; Gerard F. Dunne

[57] ABSTRACT

In furnishing an RF modulator with a reference signal generator for generating a specified test signal, and a switching circuit for switching a video signal and the test signal on occasion; the reference signal generator and the switching circuit are received in a shield case of the RF modulator, thereby to prevent radiated interferences.

3 Claims, 5 Drawing Figures

RF MODULATOR

BACKGROUND OF THE INVENTION

The present invention relates to an RF modulator for converting the video signal of a video tape recorder or the like into a signal suitable for a television or the like.

In a conventional video tape recorder (hereinbelow, abbreviated to "VTR"), video disk player (hereinbelow, abbreviated to "VD") and video camera (hereinbelow, abbreviated to "TV camera"), an RF modulator 17 as shown in FIG. 1 has been generally employed.

The RF modulator 17 is so constructed that a clamp circuit 1, a video amplifier circuit 2, a video modulation circuit 3, a carrier generator circuit 5, an audio amplifier circuit 9, an audio modulation circuit 7, an audio oscillator circuit 8, a frequency converter circuit 6 and a carrier change-over switch 16 are received in a shield case 17a. It operates so that a video signal supplied through a switching circuit 18 from a video signal source 12 in the VTR, VD, TV camera or the like and an audio signal supplied from an audio signal source 10 are converted into a suitable signal for a television, which is prescribed according to the local broadcasting standards.

The TV signal delivered from the RF signal output terminal 4 of the RF modulator 17 is supplied to, for example, the antenna terminal of a television receiver (not shown). In a device in which the carrier of the RF modulator 17 can be changed at will by means of the switch 16 or the like, a reference signal generator 11 for generating a specified video signal not used by the general broadcasting stations, i.e., a test signal, is disposed so that the TV signal transmitted from the VTR, VD or TV camera can be distinguished from a TV signal transmitted from a broadcasting station in the television receiver. Thus, the test signal from the reference signal generator 11 can be supplied to the RF modulator 17 on occasion by operating the switching circuit 18.

However, in the device in which the reference signal generator 11 and the switching circuit 18 are arranged outside the shield case 17a of the RF modulator 17 as in the prior art, an undesirable radiated interference from the reference signal generator 11 may develop. Another problem is that a signal from the carrier generator circuit 5 or the audio oscillator circuit 8 may propagate to a cable connecting the RF modulator 17 and the reference signal generator 11, so an undesirable radiated interference may develop.

SUMMARY OF THE INVENTION

The present invention has been made in order to eliminate the disadvantage of the prior art, and has for its object to provide an RF modulator which prevents the undesirable radiated interferences and which is low in cost.

In one aspect of performance of the present invention, a reference signal generator which generates a specified test signal to be switched from a video signal of a VTR or the like and supplied to a modulation circuit of an RF modulator on occasion is received in a shield case which receives the RF modulator.

PREFERRED EMBODIMENT OF THE INVENTION

Figure 1:
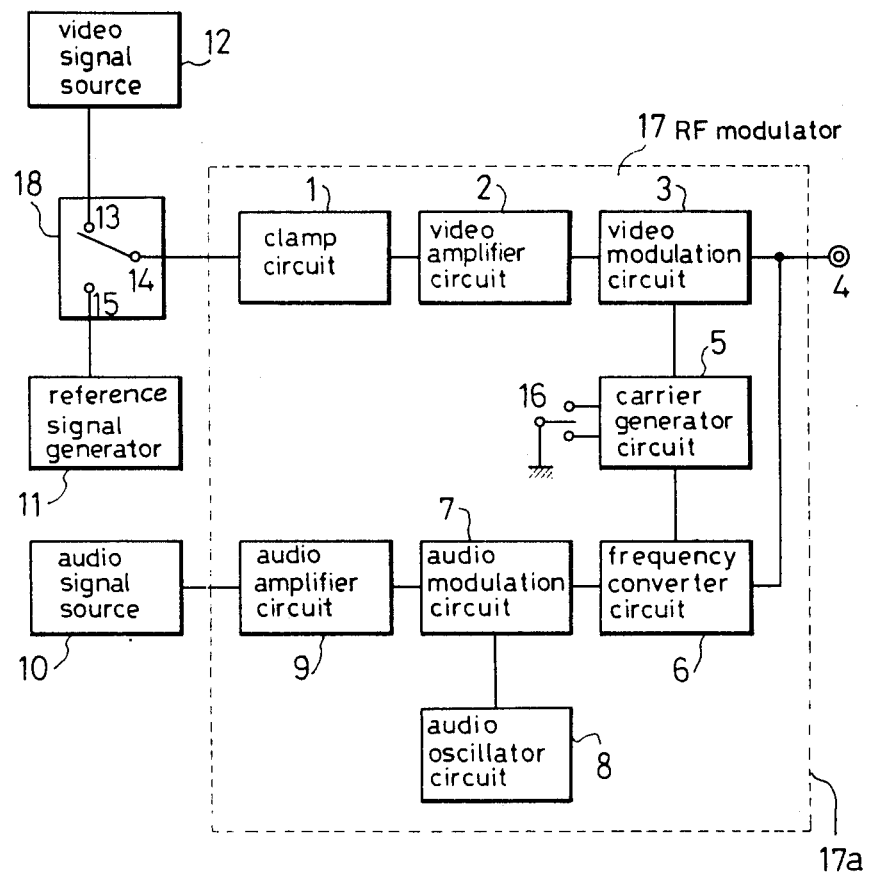
FIG. 1 is a block diagram of a prior-art RF modulator.
Figure 2:
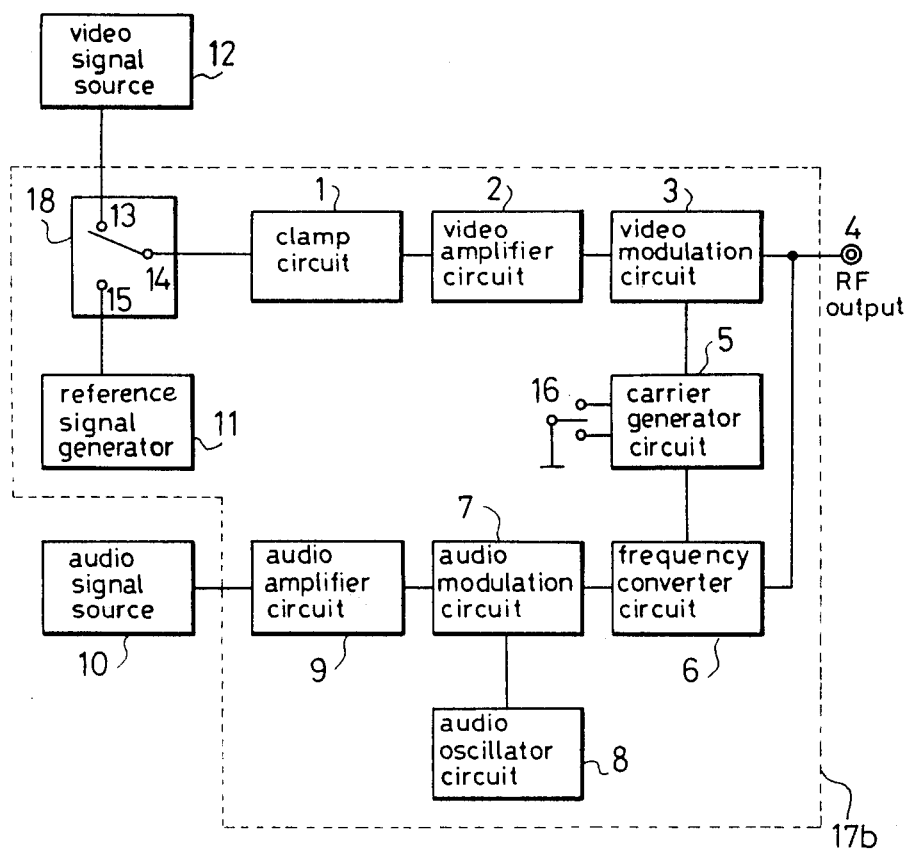
FIG. 2 is a block diagram of an RF modulator embodying the present invention.

FIG. 2 is a block diagram showing an embodiment of the present invention. The embodiment is so constructed that a clamp circuit 1, a video amplifier circuit 2, a video modulation circuit 3, a carrier generator circuit 5, an audio amplifier circuit 9, an audio modulation circuit 7, an audio oscillator circuit 8, a frequency converter circuit 6, a reference signal generator 11 and a switching circuit 18 are received in a single shield case 17b.

Since the reference signal generator 11 and the switching circuit 18 are received in the shield case 17a in this manner, the undesirable radiated interference from the reference signal generator 11 can be eliminated, and also the undesirable radiated interference from a connecting cable can be eliminated. Further, coaxial cables for connecting the reference signal generator 11 and the switching circuit 18, and this switching circuit 18 and the clamp circuit 1 are dispensed with, and the reference signal generator 11 can be arranged on a circuit board within the modulator. These are meritorious in point of cost.

Figure 3:
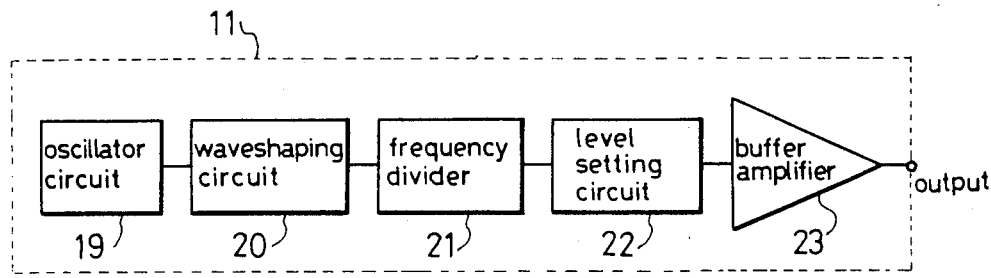
FIG. 3 is a block diagram of a reference signal generator included in the embodiment of FIG. 2.

FIG. 3 is a block diagram of the reference signal generator 11 for use in the embodiment of FIG. 2. In FIG. 3, numeral 19 designates an oscillator circuit, numeral 20 a waveshaping circuit, numeral 21 a frequency divider, numeral 22 a level setting circuit, and numeral 23 a buffer amplifier. This reference signal generator 11 provides a signal of a waveform as shown in FIG. 4.

Figure 4:
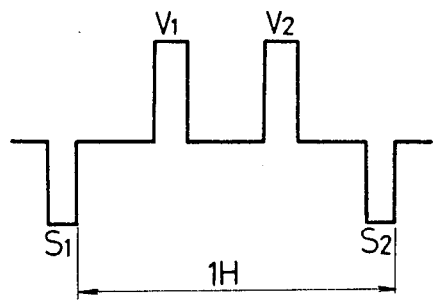
FIG. 4 is a waveform diagram of a signal produced from the reference signal generator in FIG. 3.
Figure 5:
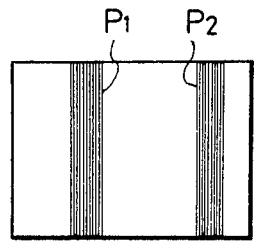
FIG. 5 is an image pattern diagram corresponding to the signal waveform in FIG. 4.

In FIG. 4, symbols $S_1$ and $S_2$ indicate horizontal synchronizing components, and symbols $V_1$ and $V_2$ video components. When this signal is converted into a TV signal by the RF modulator and the converted signal is received by a TV receiver, an image pattern as shown in FIG. 5 is obtained. Symbols $P_1$ and $P_2$ in FIG. 5 indicate vertical stripes obtained in correspondence with the respective video components $V_1$ and $V_2$ in FIG. 4.

As set forth above, according to the present invention, the reference signal generator for generating the specified test signal and the switching circuit for switching the video signal and the test signal on occasion are received in the shield case for receiving the RF modulator. Therefore, the undesired radiated interferences are eliminated, and the cost is reduced. These are greatly effective in practical use.

We claim:

1. In an RF modulator having a modulation circuit which modulates a video signal of a video tape recorder or the like and converts it into a TV signal; an RF modulator device characterized in that a reference signal generator which generates a specified test signal to be switched from said video signal and supplied to said modulation circuit on occasion is received in a shield case which receives said RF modulator.

2. In an RF modulator having a modulation circuit which modulates a video signal of a video tape recorder or the like and converts it into a TV signal; an RF modulator device characterized in that a reference signal generator which generates a specified test signal, and a switching circuit which supplies said video signal and said test signal to said modulation circuit by switching them on occasion, are received in a shield case which receives said RF modulator.

3. In a RF modulator having means including a modulation circuit for modulating a video signal from a video recorder or the like and converting it into a signal for a video monitor, and means including a reference signal generator and a switching circuit for producing a test signal to be delivered on occasion to said monitor, the improvement wherein said modulation circuit, said reference signal generator and said switching circuit are housed in a common shield case.

* * * * *